(12) United States Patent
Polnyi

(10) Patent No.: US 8,287,296 B2
(45) Date of Patent: Oct. 16, 2012

(54) SOCKET CONNECTOR HAVING CPU RETENTION ARRANGEMENT

(75) Inventor: Igor Polnyi, Aurora, IL (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 132 days.

(21) Appl. No.: 12/954,898

(22) Filed: Nov. 28, 2010

(65) Prior Publication Data

US 2012/0135623 A1    May 31, 2012

(51) Int. Cl.
*H01R 13/625* (2006.01)
(52) U.S. Cl. ........................................... 439/342
(58) Field of Classification Search .................. 439/342, 439/259, 264–268
See application file for complete search history.

(56) References Cited

U.S. PATENT DOCUMENTS

| | | | |
|---|---|---|---|
| 6,338,640 B1 | 1/2002 | Lin | |
| 7,056,140 B1* | 6/2006 | Jiang | 439/342 |
| 7,607,932 B1 | 10/2009 | Polnyl | |
| 2005/0064754 A1* | 3/2005 | Tan | 439/342 |
| 2006/0141841 A1* | 6/2006 | Liao et al. | 439/342 |
| 2008/0214037 A1* | 9/2008 | Liao | 439/342 |
| 2008/0280473 A1* | 11/2008 | Zhou et al. | 439/259 |
| 2008/0311777 A1* | 12/2008 | Liao | 439/342 |

* cited by examiner

*Primary Examiner* — Jean F Duverne
(74) *Attorney, Agent, or Firm* — Wei Te Chung; Ming Chieh Chang

(57) ABSTRACT

An electrical connector adapted for electrically connecting an electronic package includes a base and at least a cam. The base has a receiving space for receiving the electronic package and at least a flange located on side of the receiving space. The cam is positioned on the flange. Each cam has a shelf and defines a first position and a second position. The cam is able to rotate between its first position and its second position for urging the electronic package to move, and when the cam is located in the second position, the shelf blocks the electronic package from a vertical direction motion.

10 Claims, 9 Drawing Sheets

SOCKET CONNECTOR HAVING CPU RETENTION ARRANGEMENT

BACKGROUND OF THE INVENTION

1. Field of the Invention

The present invention relates to a socket connector, and more particularly to a low insertion force socket connection in which a cam having a depressing flange is incorporated such that a CPU packet seated thereon can be properly retained in position after the cam is rotated. The present invention also relates to a socket connector in which two cams are incorporated.

2. Description of Related Art

A PGA socket is used for electrically connecting an electronic package to a printed circuit substrate, such as a printed circuit board. The PGA socket, such as U.S. Pat. No. 6,338,640 issued to Lin on Jan. 15, 2002, typically comprises a base supporting a plurality of contacts, a cover including a plurality of insertion holes, and an actuating cam disposed between the base and the cover. The base is mounted on the circuit substrate to form electrical connections between the contacts and circuits on the circuit substrate. The cover is attached to the base prior to assemble to the circuit substrate. When the electronic package is assembled to the cover, the cover is driven by the actuating cam to move horizontally along the base to make the electronic package connects with the contacts. In this typically electrical connector, the actuating cam is only used to drive the cover and does not have other functions.

Another type of PAG socket is designed at present, such as U.S. Pat. No. 7,607,932 issued to Igor on Oct. 14, 2009 discloses a PGA socket. The socket comprises an insulative base with a receiving space for retaining the electronic package and two cams disposed opposite sides of the receiving space of the insulative base. Each cam defines a first position where the electronic package can be easily put in or removed from the receiving space and a second position where the cam is close to a center of the receiving space relative to the first position. When one of the cams is driven to rotate from its first position to its second position, the cam can force the electronic package received in the receiving space to move to a working state. When removing the electronic, said cam back rotates to its first position, then the other cam is driven to rotate from its first position to its second position, the cam force the electronic package to return to its initial position.

Those two cams disclosed and taught in above patent of Igor are only used to rotate to drive the electronic package, while additional arrangement, such as a heat sink and clip are required to retain the CPU in place. However, if the socket is required to have a low profile and/or in some application that a microprocessor package doesn't require a thermal device or equivalent, then the CPU has to be properly retained so as to impose, a restriction of the package motion in the vertical direction.

Therefore, an improved socket is required to overcome the disadvantages of the prior art.

SUMMARY OF THE INVENTION

An object of the present invention is to provide a low insertion force socket connection in which a cam having a depressing flange is incorporated such that a CPU packet seated thereon can be properly retained in position after the cam is rotated.

To achieve the aforementioned object, an electrical connector adapted for electrically connecting an electronic package comprises a base and at least a cam. The base has a receiving space for receiving the electronic package and at least a flange located on side of the receiving space. The cam is positioned on the flange. The shelf extends into the receiving space when the cam is rotated into a locking position.

To further achieve the aforementioned object, an electrical connector assembly adapted for electrically connecting an electronic package comprises an electrical connector and the electronic package. The electrical connector comprises an insulative base defining a receiving space and equipped with a cam disposed at an end of the receiving space, and a plurality of contacts disposed in the base. The electronic package is disposed in the receiving space and moveable between a first location where the electronic package is not engaged with the contacts for loading/unloading, and a second location where the electronic package is engaged with the contacts for electrical connection. The cam rotatably defines a first position allowing the electronic package to be at the first location, and a second position urging the electronic package to be at the second location and lock the electronic package in vertical direction.

Other objects, advantages and novel features of the invention will become more apparent from the following detailed description of a preferred embodiment when taken in conjunction with the accompanying drawings.

DETAILED DESCRIPTION OF THE INVENTION

Figure 1:
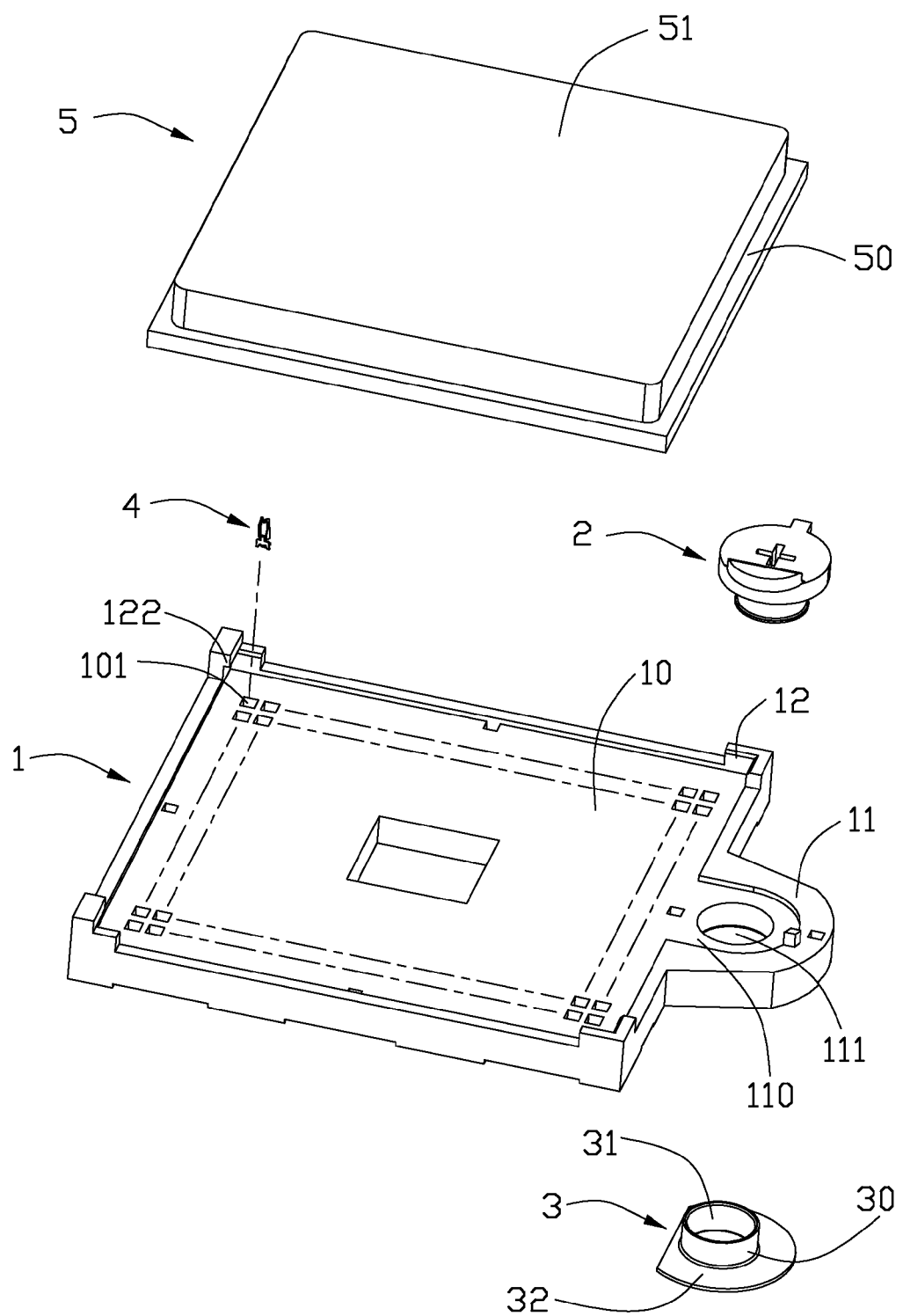
FIG. 1 is an exposed, perspective view of an electrical connector assembly in the first embodiment in accordance with the present invention.

Referring to FIG. 1-FIG. 6, an electrical connector in accordance with a first preferred embodiment of the present invention is adapted for electrically connecting an electronic package 5 to a printed circuit board (not shown), the electrical connector comprises an insulative base 1, at least one metallic cam 2 assembled to the base 1, at least one metallic plate 3 for retaining the cam 2 in the base 1, and a plurality of contacts 4.

Referring to FIG. 1, the base 1 comprises a receiving space 10 in the shape of a square, and a flange 11 disposed on one side of the receiving space 10. The receiving space 10 is formed as a recess and a plurality of sidewalls 12 is disposed at four sides of the receiving space 10, for retaining the electronic package 5 together. The receiving space 10 defines a plurality of passageways 101 extending vertically therethrough for receiving the contacts 4. One of the sidewalls 12 located at an opposite side of the flange 11 have retaining notches 122 extending toward the receiving space 10 from two ends thereof. At least one spring (not shown) is optionally disposed at a same side of the retaining notches 122.

The flange 11 is configured with an approximately arc shape and defines a recess 110 downwardly recessed from a center thereof and a circle hole 111 vertically passing through the recess 110. The recess 110 has a bottom face which is coplanar with a top surface of the receiving space 10 and communicates with the receiving space 10. The flange 11 further has a projection 113 extending upwardly from a top surface thereof.

Figure 2:
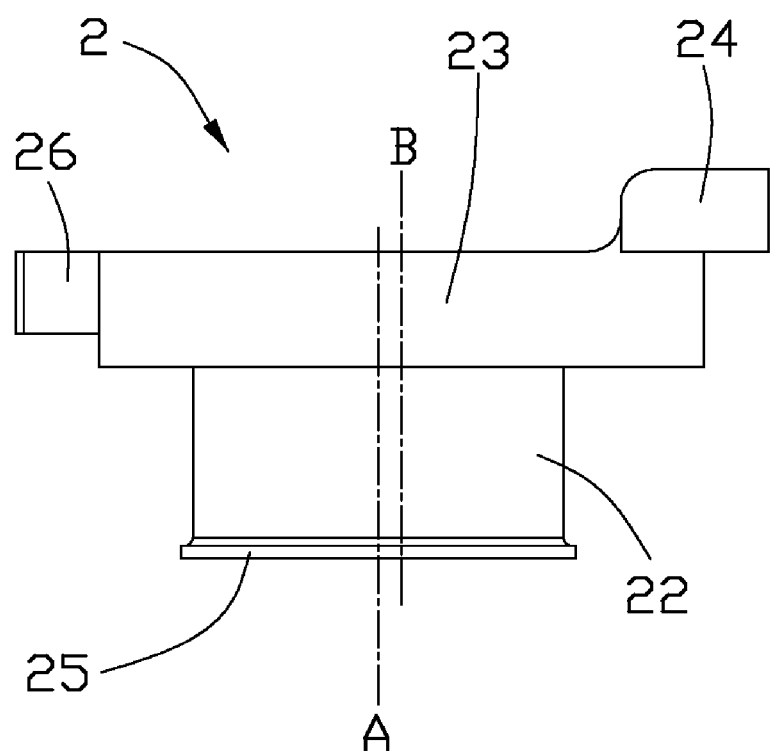
FIG. 2 is a side view of a cam of the electrical connector shown in FIG. 1.
Figure 3:
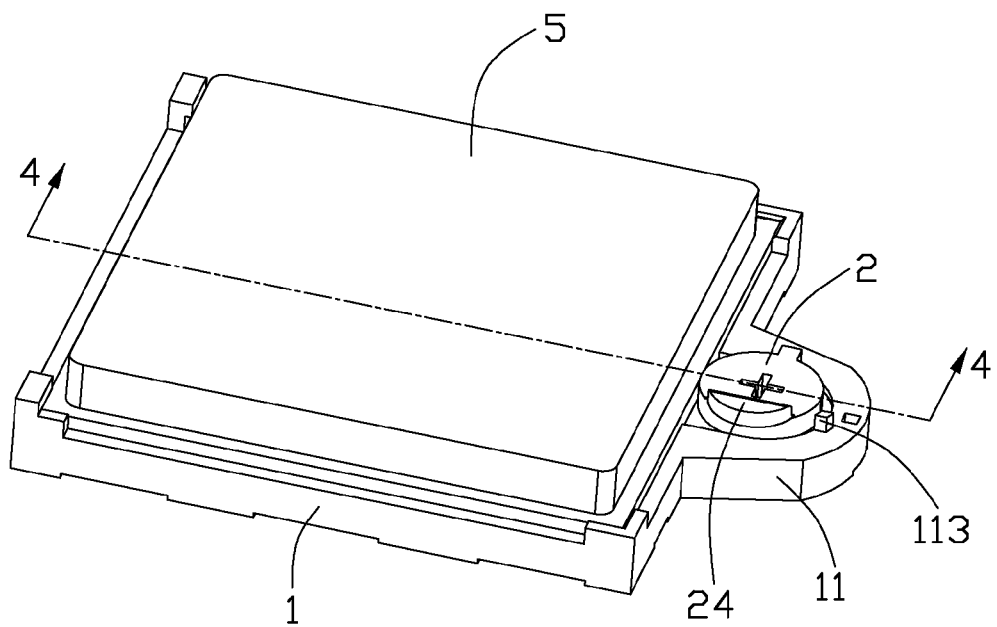
FIG. 3 is an assembled, perspective view of the electrical connector shown in FIG. 1, wherein the cam is located in a first position.
Figure 4:
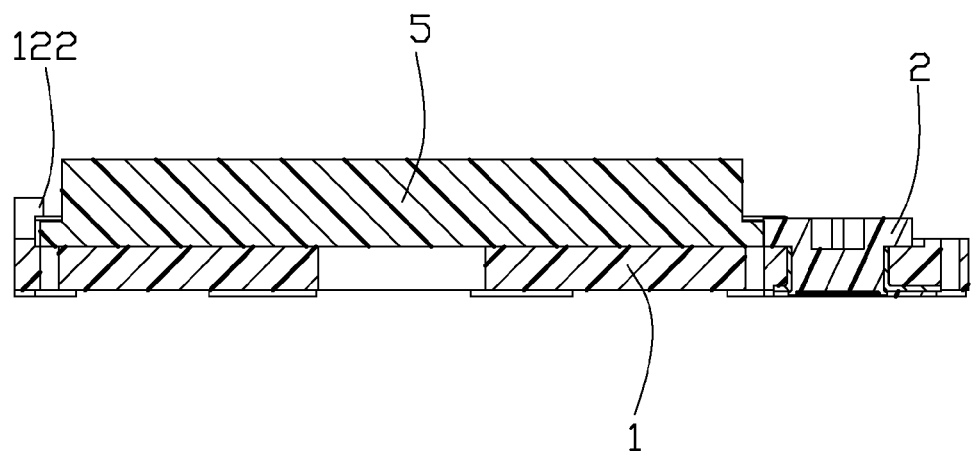
FIG. 4 is a cross-sectional view taken along line 4-4 of FIG. 3.
Figure 5:
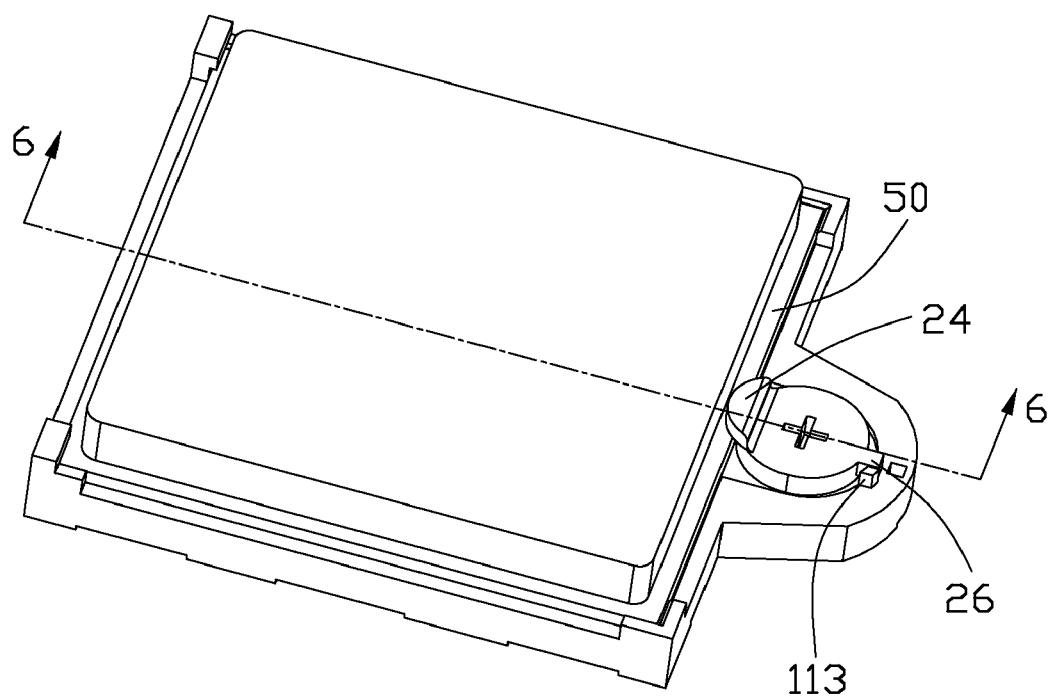
FIG. 5 is similar with FIG. 3, but the cam located in a second position.
Figure 6:
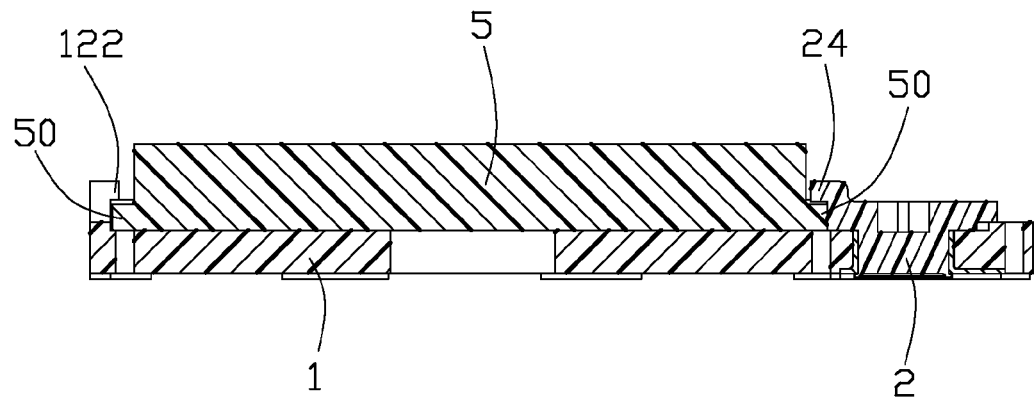
FIG. 6 is a cross-sectional view taken along line 6-6 of FIG. 5.

Referring to FIG. 2, the cam 2 comprises a first cylindrical post 22 passing through the circle hole 111 of the flange 11 and a second cylindrical post 23 located on the recess 110 of the flange 11, and a riveting end 25 disposed on a bottom end of the first cylindrical post 22 and extending beyond the bottom surface of the base 1. The cam 2 further comprises a shelf 24 disposed upon the second cylindrical post 23 and a stopper 26 extending from an opposite side of the second cylindrical post 23. The shelf 24 is located at the side which the second cylindrical post 23 engages and drives the electronic package 5.

The metal plates 3 has a tubular portion 30 with an aperture 31 and a horizontal piece 32 outwardly extending from a circumference bottom edge of the tubular portion 30. The metallic plate 3 is mounted to the flange 11 of the base 1 from a bottom side, the horizontal piece 32 is received in bottom of the flange 11, and the tubular portion 30 is inserted into the circle hole 111 of the base 1 and receives the first cylindrical post 22. The metallic plate 3 is riveted with the riveting end 25 to retain the cam 2 on the base 1.

The cam 2 is rotated between a first position and a second position which the second cylindrical post 23 is more closed to a center of the receiving space 10 relative to the first position for driving the electronic package 5 to electrically connect with the contacts 4. Referring to FIG. 2, a center axis B of the second cylindrical post 23 is offset from a center axis A of the first cylindrical post 22, while the center line A is a rotational axis, so the second cylindrical post 23 can occur a deflection rotation and enter the receiving space 10 to forces the electronic package 5 to move horizontally.

The electronic package 5 includes a planer substrate 50 and a die 51 protruding upwardly from the substrate 50. Referring to FIGS. 3-6, when the cam 2 rotated from the first position to the second position after the electronic package 5 is assembled, the electronic package 5 is forced to move toward the sidewalls 12 at an opposite end of the receiving space 10 and the substrate 50 slide below and is locked by the retaining notches 122 of the sidewalls 12, the spring (not shown) is compressed, finally, the stopper 26 of the cam 2 is stopped by the projection 113 of the base 1 and the shelf 24 of the cam 2 is located upon and locks the substrate 50 in a vertical direction. So the retaining notches 122 and the shelf 24 cooperatively limit an upward movement of the electronic package 5. When removing the electronic package 5 from the electrical connector, rotates the cam 2 to the first position and the spring (not shown) forces the electronic package 5 back to the original position, then to be taken out the electronic package 5 by an operator.

Figure 7:
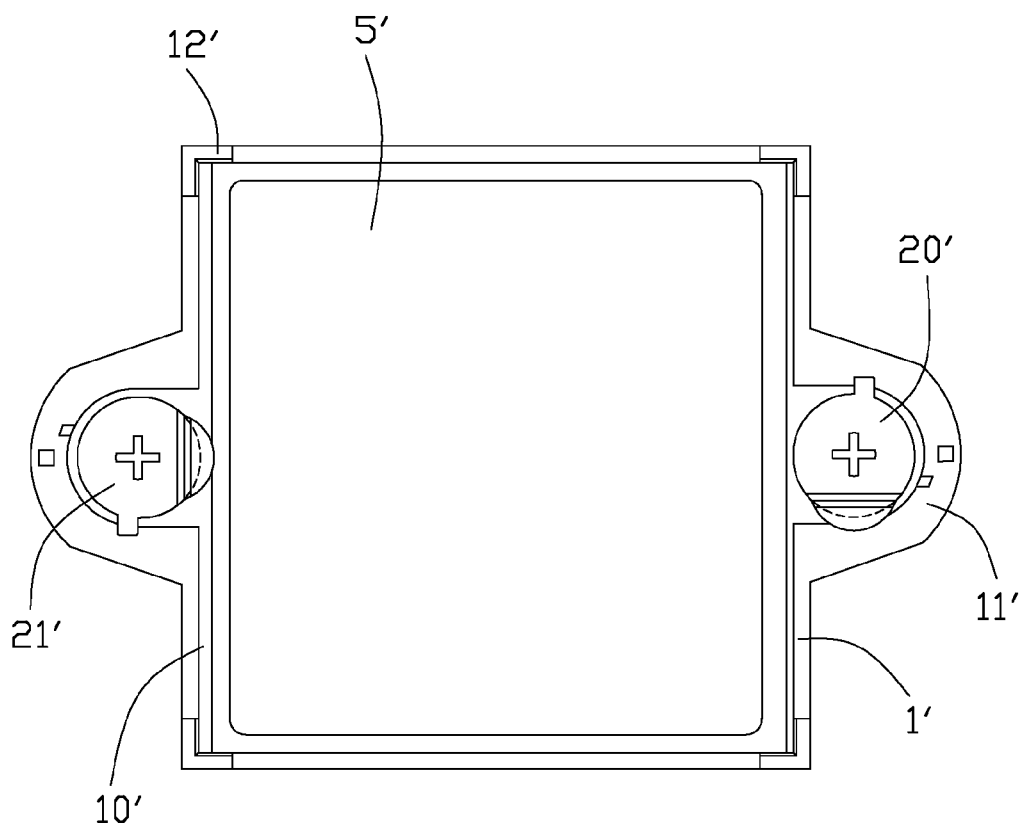
FIG. 7 is an assembled, perspective view of the electrical connector in the second embodiment in accordance with the present invention, showing the two cams both located at the first position.
Figure 8:
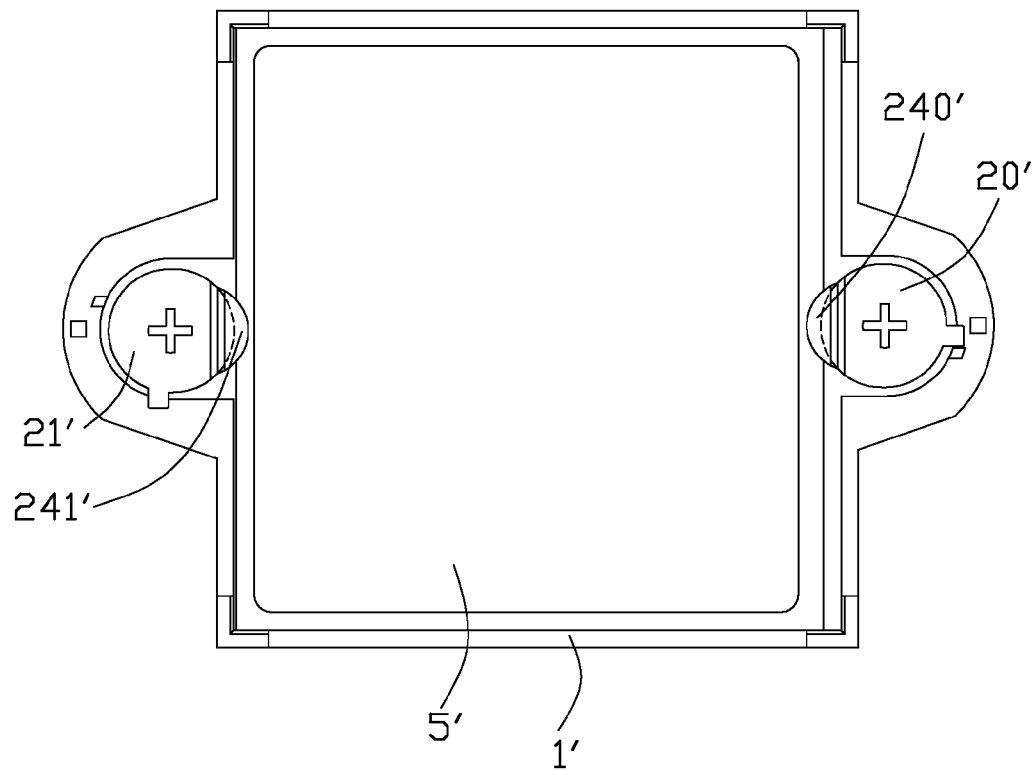
FIG. 8 is similar with FIG. 7, except that a first cam of the electrical connector located at the second position.

FIGS. 7-9 shows another electronic connector in a second embodiment of the present invention which is similar with that in the first embodiment. Referring to FIGS. 7-8, the base 1' has a receiving space 10' and a pair of flanges 11' disposed on opposite sides of the receiving space 10'. The receiving space 10' has sidewalls 12' without retaining notches 122. A pair of cams are retained to the flanges 11' and include a first cam 20' and a second cam 21'. Each cam 20', 21' has a shelf 240', 241' to lock the electronic package 5' in a vertical direction, while the shelf 241' of the second cam 21' has a different position relative to the shelf 240' disposed on the first cam 20', the first cam 20' is the same with the cam 2 of the electrical connector in the first embodiment.

The first cam 20' and the second cam 21' both have a first position and a second position where the second cylindrical posts 230', 231' are more closed to a center of the receiving space 10' relative to the first position. FIG. 7 shows the cams in the original position where the first cam 20' and the second cam 21' are both located in a first position, and the shelf 241' of the second cam 21' is disposed into the receiving space 10'. At this state, the electrical connector is open, the electronic package 5' can be easily put in the receiving space 10'.

FIGS. 9A-9D are sketch views to show an operating process of the electrical connector. When the electronic package 5' is assembled in the base 1' (see FIG. 9A), the first cam 20' is driven to rotate from its first position to its second position and forces the electronic package 5' to move toward and abut against the opposed sidewalls 12' and the substrate 50' of the electronic package 5' slides below the shelf 241' of the second cam 21'. In this condition, the substrate 50' is locked by the shelves 240', 241' of the first cam 20' and the second cam 21'. Anyway, the electronic package 5' is retained in a steady closed state for working.

Figure 9A:
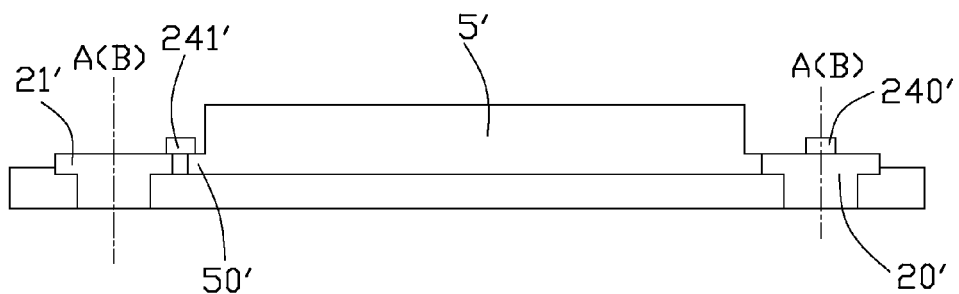
FIG. 9 is a sketch view to show an operating process of the socket.
Figure 9B:
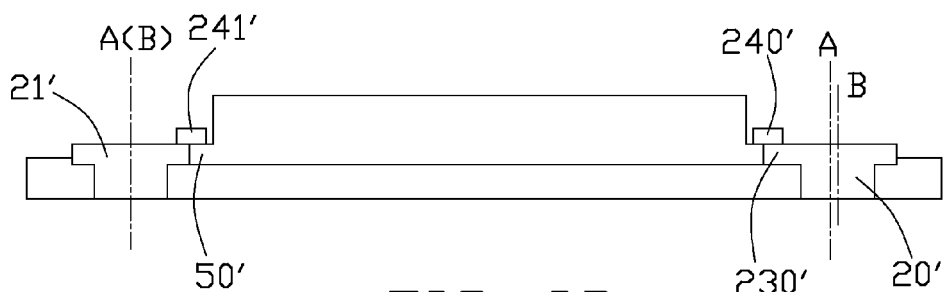
Figure 9C:
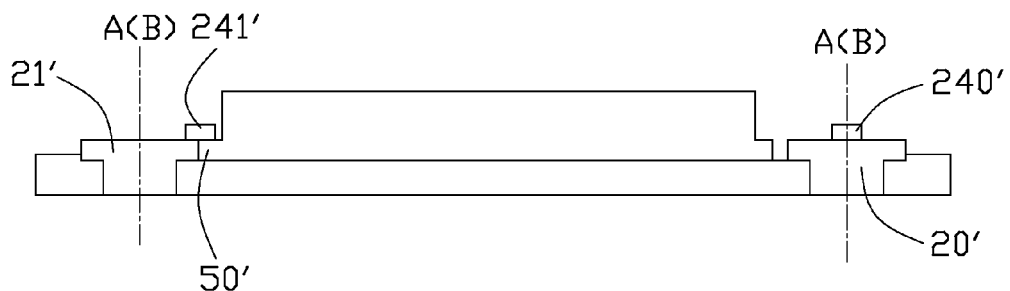
Figure 9D:
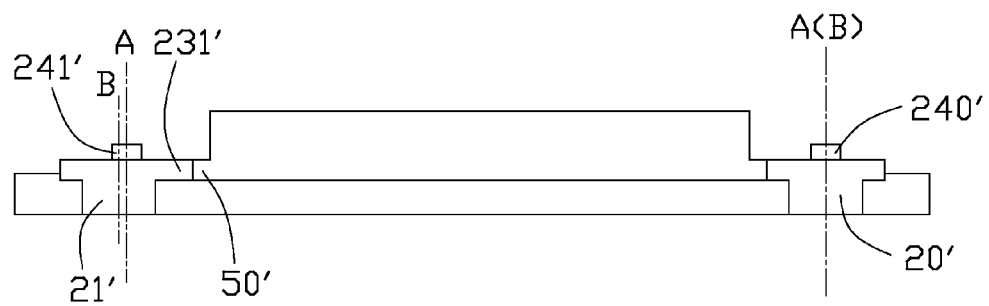

Referring to FIG. 9D, when removes the electronic package 5' from the base 1', the first cam 20' rotates from its second position to its first position, then the second cam 21' rotates from its second position to its first position to drive the electronic package 5' back to the original position. In this state, the shelves 240' 241' both move away from the receiving space 10 so the electronic package 5' can be easily picked up from the receiving space 10'.

The electrical connector has a simple configure with a simple cam 2 and without a cover, the cam 2 also can reliably retain the electronic package 5 in the receiving space 10 of the base 1 to prevent the electrical connector from moving in the vertical direction. For the electrical connector do not have a cover and a foreign heat sink, that make the electrical connector has a low profile.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector adapted for electrically connecting an electronic package, comprising:
   a base having a receiving space for receiving the electronic package and a flange located on a side of the receiving space; and
   a cam positioned on the flange and having a shelf, the shelf extending into the receiving space when the cam is rotated into a locking position; wherein the receiving space has a plurality of sidewalls surrounding the receiving space; wherein the cam includes a first cylindrical post and a second cylindrical post offset the first cylindrical post, and the shelf is disposed upon the second cylindrical post; wherein the base has another flange and another cam received in the another flange, the shelf of the cam is located opposite to an engage side of the second cylindrical post which engages with the electronic package, and the another cam has another shelf with a different position relative to the shelf disposed on the cam; wherein the another cam also defines a first position and a second position, when the two cams are both located at the first position, the another shelf of the another cam is disposed into the receiving space, after the electronic package is assemble to the receiving space, the cam drives the electronic package to move from its first position to its second position, then both the shelves of two cams block the electronic package in the vertical direction.

2. The electrical connector as claimed in claim 1, wherein the cam further has a stopper at an edge of the second cylindrical post, and the stopper is disposed opposite to the shelf.

3. The electrical connector as claimed in claim 1, wherein one of the sidewalls opposite to the flange has at least a tab having a retaining notch.

4. The electrical connector as claimed in claim 3, wherein when the cam rotates from a first position to a second position, the electronic package slides into a space under the retaining notches of the sidewall, so the retaining notches and the shelf of the cam together lock the electronic package.

5. An electrical connector assembly adapted for electrically connecting an electronic package, comprising:
an electrical socket assembly comprising:
an insulative base defining a receiving space and equipped with a cam disposed at an end of the receiving space;
a plurality of contacts disposed in the base;
an electronic package disposed in the receiving space and being moveable between a first location where the electronic package is not engaged with the contacts for loading/unloading, and a second location where the electronic package is engaged with the contacts for electrical connection;
the cam directly engageable with the electronic package and rotatably defining a first position allowing the electronic package to be at the first location, and a second position urging the electronic package to be at the second location and locking the electronic package in a vertical direction; wherein the cam has a shelf at a side thereof to lock the electronic package; wherein the electrical connector only has one cam located on one end of the receiving space which has a plurality of sidewalls, one of the sidewalls disposed on the other end of the receiving space have retaining notches to block the electronic package; wherein the electrical connector has two cams located at opposite ends of the receiving space, the first cam moves from its first position to its second position to drive the electronic package to engage with the contacts, and the second cam moves from its first position to its second position to drive the electronic package to separate from the contacts.

6. An electrical connector comprising:
an insulative base defining opposite first and second end regions in a lengthwise direction;
a plurality of contacts disposed in the base for mechanically and electrically connecting to an electronic package which is adapted to be mounted upon the base and back and forth moveable in said lengthwise direction;
a first retention structure formed on the first end region, and a second retention structure formed on the second end region;
the first retention structure including a rotatable cam defining a lower supporting section received in the base, a middle pushing section adjacent above a top face of the base adapted to laterally push one end of the electronic package toward the second end region, and an upper locking section adapted to downward press said one end of said electronic package; and
the second retention structure being adapted to downward press the other end of said electronic package; wherein said second retention structure is movable; wherein said second retention structure includes another cam defining a lower supporting portion received in the base, a middle abutment section for abutting against the other end of the electronic package toward the first end region, and an upper locking portion for downward pressing the other end of the electronic package; wherein the cam is rotatable about a vertical axis, the middle pushing section defines a relatively longer radius at a circumferential position, and the upper locking section defines another relatively longer radius at another circumferential position under condition that said circumferential position and said another circumferential position are located at a same radial direction of said cam.

7. The electrical connector as claimed in claim 6, wherein said second retention structure is immovable.

8. The electrical connector as claimed in claim 6, wherein said another cam is rotatable about another vertical axis, the middle abutment section defines another relatively greater radius at a peripheral position, and the upper locking portion defines another relatively greater radius at another peripheral position under condition that said peripheral position and said another peripheral position are located in different radial directions.

9. The electrical connector as claimed in claim 6, wherein said base defines a receiving space surrounded by side walls for receiving said electronic package therein.

10. The electrical connector as claimed in claim 9, wherein said cam communicates with said receiving space.

* * * * *